United States Patent
Yamamoto

(10) Patent No.: US 8,513,586 B2
(45) Date of Patent: Aug. 20, 2013

(54) SEMICONDUCTOR DEVICE AND ELECTRONIC APPARATUS

(75) Inventor: Keiichi Yamamoto, Kanagawa (JP)

(73) Assignee: Sony Corporation (JP)

( * ) Notice: Subject to any disclaimer, the term of this patent is extended or adjusted under 35 U.S.C. 154(b) by 310 days.

(21) Appl. No.: 12/967,815

(22) Filed: Dec. 14, 2010

(65) Prior Publication Data

US 2011/0155891 A1    Jun. 30, 2011

(30) Foreign Application Priority Data

Dec. 28, 2009    (JP) .................................. 2009-298365

(51) Int. Cl.
*H01L 31/042*    (2006.01)

(52) U.S. Cl.
USPC ..................... 250/208.1; 250/214.1; 257/431; 136/252; 977/954

(58) Field of Classification Search
USPC ................... 250/208.1, 214.1; 977/932, 953, 977/954; 257/431, 432, E31.127, E27.134, 257/436, 443, E31.001, E31.054; 136/252
See application file for complete search history.

(56) References Cited

U.S. PATENT DOCUMENTS

| | | | | |
|---|---|---|---|---|
| 7,109,517 | B2 * | 9/2006 | Zaidi | 257/22 |
| 7,430,039 | B2 * | 9/2008 | Sugita | 356/39 |
| 7,586,167 | B2 * | 9/2009 | Gorrell et al. | 257/431 |
| 7,847,362 | B2 * | 12/2010 | Ogino et al. | 257/436 |
| 8,094,394 | B2 * | 1/2012 | Yamada et al. | 359/885 |
| 2006/0131695 | A1 * | 6/2006 | Kuekes et al. | 257/618 |
| 2007/0257328 | A1 * | 11/2007 | Gorrell et al. | 257/428 |
| 2008/0231859 | A1 * | 9/2008 | Ogino | 356/451 |
| 2009/0008735 | A1 * | 1/2009 | Ogino et al. | 257/436 |
| 2009/0040132 | A1 * | 2/2009 | Sridhar et al. | 343/911 R |
| 2009/0284829 | A1 * | 11/2009 | Bower et al. | 359/326 |
| 2010/0220377 | A1 * | 9/2010 | Yamada et al. | 359/241 |
| 2011/0023941 | A1 * | 2/2011 | DiDomenico | 136/246 |
| 2011/0043813 | A1 * | 2/2011 | Yamada | 356/447 |
| 2011/0155891 | A1 * | 6/2011 | Yamamoto | 250/208.1 |
| 2011/0197959 | A1 * | 8/2011 | Catchpole et al. | 136/256 |
| 2012/0075688 | A1 * | 3/2012 | Yamada et al. | 359/241 |

FOREIGN PATENT DOCUMENTS

| | | |
|---|---|---|
| JP | 2009-038352 | 2/2009 |
| JP | 2009-147326 | 7/2009 |

* cited by examiner

*Primary Examiner* — John Lee
(74) *Attorney, Agent, or Firm* — Sheridan Ross P.C.

(57) ABSTRACT

A semiconductor device includes: a photoelectric conversion layer; a continuous or discontinuous cylindrical metal microstructure embedded in the photoelectric conversion layer; and a dielectric film with which an inner side surface and an outer side surface of the metal microstructure are coated.

11 Claims, 12 Drawing Sheets

SECTIONAL VIEW TAKEN ALONG LINE A-A

SECTIONAL VIEW TAKEN ALONG LINE B-B

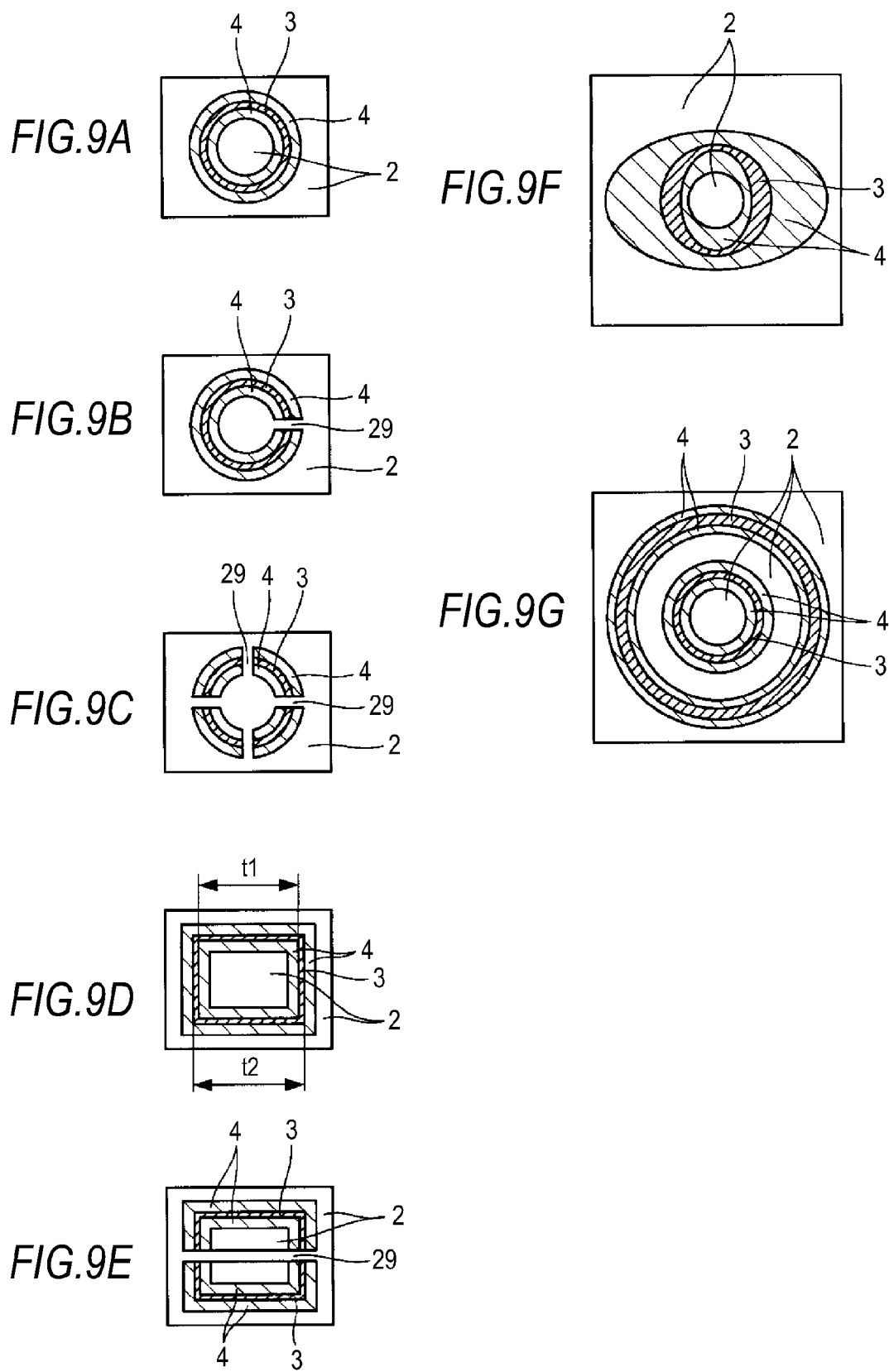

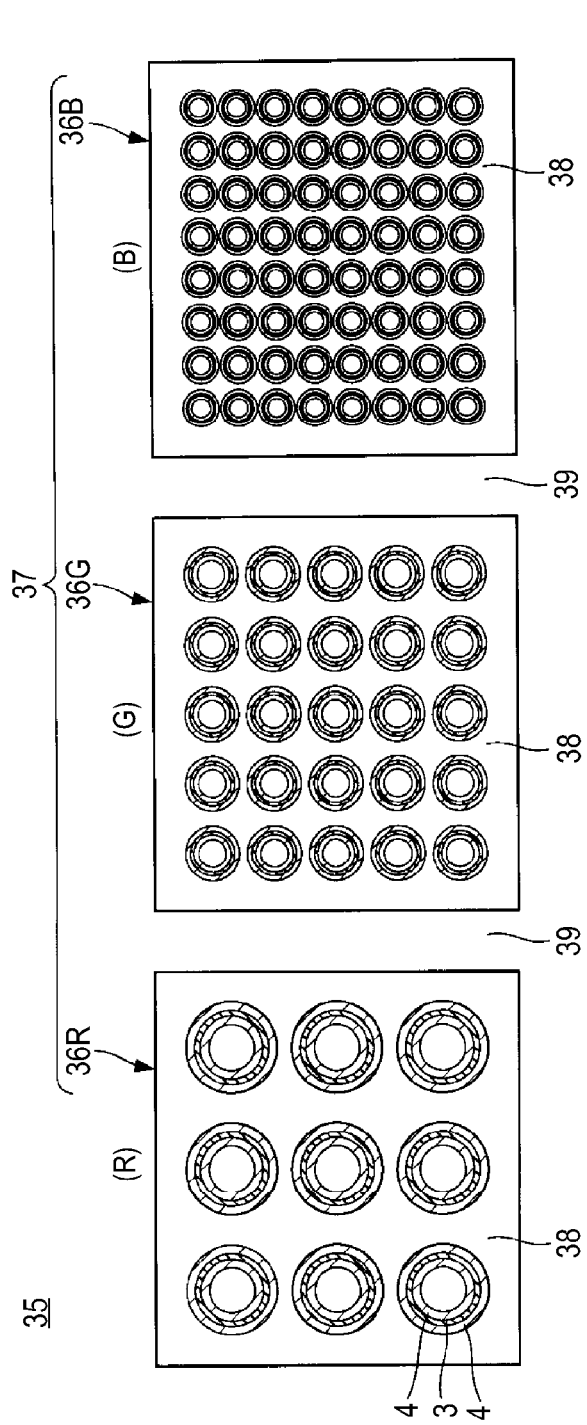
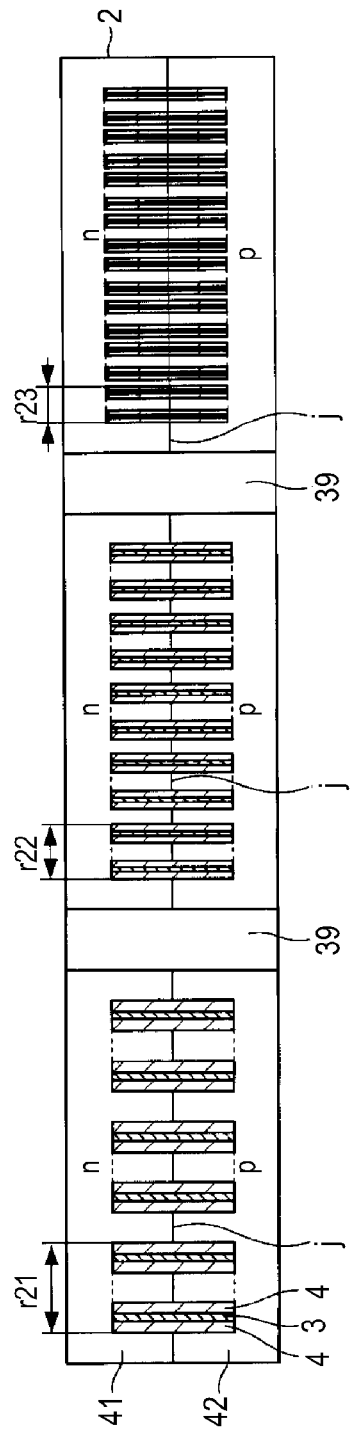
FIG.11A
FIG.11B

SEMICONDUCTOR DEVICE AND ELECTRONIC APPARATUS

BACKGROUND OF THE INVENTION

1. Field of the Invention

The present invention relates to a semiconductor device utilizing a plasmon phenomenon and an electronic apparatus such as a camera having a solid-state imaging device constituted by such a semiconductor device.

2. Description of the Related Art

Recently, keen attention is paid to special light referred to as surface plasmons attributable to intense electric fields generated in microscopic regions as a result of coupling between light and a metal-type material such as gold, silver, copper, or aluminum occurring under special conditions. In practice, applications of such a phenomenon are actively pursued in biological fields, the applications including SPR microscopes in which a combination of a Kretschmann configuration and attenuated total reflection is used to observe absorption of monomolecules such as protein monomolecules. Attenuated total reflection may be abbreviated as "ATR", and "SPR" is the abbreviation of surface plasmon resonance.

Techniques for reducing the thickness of photodiodes of image sensors (so-called solid-state imaging devices) and improving the sensitivity of the photodiodes taking advantage of plasmons have been proposed (see JP-A-2009-38352 and JP-A-2009-147326 (Patent Documents 1 and 2)).

FIGS. 14A and 14B show image sensors described in Patent Document 1. Basically, the image sensors have plasmon resonators (metal particles) embedded therein, which allows the sensors to be provided with a small thickness and a spectroscopic function acting in the depth direction thereof. An image sensor 101 shown in FIG. 14A has an n-type semiconductor region 103, a p-type semiconductor region 104, and another n-type semiconductor region 105 formed in the order listed on a p-type semiconductor substrate 102 to provide a photoelectric conversion layer having p-n junctions on. Plasmon resonators 106 which undergo plasmon resonance with red light R are embedded in the p-type semiconductor substrate 102. Plasmon resonators 107 which undergo plasmon resonance with green light G are embedded in the n-type semiconductor region 103. Plasmon resonators 108 which undergo plasmon resonance with blue light B are embedded in the p-type semiconductor region 104. Each of the plasmon resonators 106, 107, and 108 is coated with a transparent insulation film 109. Light L enters the photoelectric conversion layer having p-n junctions, and red, green, and blue beams of light enter the plasmon resonators 106, 107, and 108. When the plasmon resonators undergo plasmon resonance with the light beams incident thereon, the red, green, and blue light beams are localized in small areas in the vicinity of the plasmon resonators 106, 107, and 108. Electrical charges generated by light beams reemitted from those areas are accumulated, and resultant signals are read out by a readout section 111.

An image sensor 113 shown in FIG. 14B has photoelectric conversion layers 115, 116, and 117 which are insulated from each other by transparent insulation films 114. Plasmon resonators 106, 107, and 108 which undergo plasmon resonance with red light R, green light G, and blue light B are embedded in the photoelectric conversion layers 115, 116, and 117, respectively. Each of the plasmon resonators 106, 107, and 108 is coated with a transparent insulation film 109. Electrodes 118A and 118B to serve as readout sections are formed on both ends of each of the photoelectric conversion layers 115, 116, and 117. Light L enters the photoelectric conversion layers 115, 116, and 117, and red, green, and blue beams of light are enhanced by the plasmon resonators 106, 107, and 108. Electrons which have been excited from the valence band into the conduction electron band as thus described are read out as signals through the electrodes 118A and 118B.

A sensor can be provided with a smaller thickness without any reduction in sensitivity by using a configuration as thus described in which a plurality of photoelectric conversion layers having plasmon resonators disposed therein are formed one over another. The sensor can be provided with a color separating function acting in the depth direction thereof because the resonance peaks of the plasmon resonators disposed in the respective photoelectric conversion layers reside in different wavebands and the resonators therefore serve as spectroscopic elements.

The intensities of light beams cannot be detected when the light beams are simply absorbed in the plasmon resonators disposed at different depths of the resonator. The intensities of light beams in the respective wavebands associated with the resonance peaks of the plasmon resonators can be detected because light beams reemitted from the plasmon resonators are photo-electrically converted by materials surrounding the resonators to convert the intensities of the incident light beams into mounts of electrical charges. The amounts of electrical charges may be acquired in the form of voltages or currents using p-n junctions and electrodes, whereby the intensities of light beams in the respective wavebands can be obtained as electrical signals.

FIGS. 15A and 15B show an image sensor described in Patent Document 2. Basically, the sensor includes metal nanoparticles disposed on a silicon surface to utilize the plasmon phenomenon, and the shapes and positions of the nanoparticles are designed to provide the sensor with a small thickness and a spectroscopic function. Specifically, an image sensor 121 shown in FIGS. 15A and 15B is formed by disposing a patterned layer 125 of metal microparticles 124 through a dielectric film 123 on a top surface of a p-n junction photodiode 122 made of silicon. The dielectric film 123 is made of $SiO_2$, SiON, $HfO_2$, $Si_3N_4$ or the like, and the dielectric film 123 has a thickness of 3 nm to 100 nm.

Metal microparticles 124 are particles of at least one type of metal selected from among a group including gold, silver, copper, aluminum, and tungsten. The patterned layer 125 of the metal microparticles 124 has a plurality of regions, and each region of the patterned layer 125 of the metal microparticles 124 is formed by a plurality of sub pixel regions, i.e., a red sub pixel region 126R, a green sub pixel region 126G, and blue sub pixel regions 126B. The metal microparticles 124 in the sub pixel regions 126R, 126G, and 126B have respective sizes descending in the order in which the regions are listed. The metal microparticles 124 may have triangular, square, pentagonal, circular, and star-like shapes, and the patterned layer 125 is formed such that optimum plasmon resonance will occur between the microparticles and light beams having particular wavelengths.

Plasmons are formed as a result of resonance between electro magnetic waves of light beams and electrons on the surface of the metal microparticles 124 of the patterned layer 125, whereby the light beams stay in the vicinity of the metal microparticles 124 for a long time. Thus, such a phenomenon or effect of the pattern layer 125 allows the time available for the photodiode diode to detect light incident on the same to be increased, whereby improved sensitivity can be achieved.

SUMMARY OF THE INVENTION

In the above-described example of the related art, the sum of the horizontal sectional areas of the metal nanoparticles is great when viewed in the traveling direction of light, and it is therefore considered that the photodiode consequently has a great reflectance. As a result, the flux of light entering the photodiode is kept small, and the generation of conduction electrons contributing to sensitivity is consequently suppressed. Electromagnetic waves enhanced by localized plasmons attributable to the metal nanoparticles reside in small areas ranging several nanometers to several tens nanometers around the metal nanoparticles. Therefore, photoelectric conversion areas contributing to sensitivity are also small, and the total amount of electrons generated in those areas is consequently small.

Further, the following fact is known. Because of physical characteristics of plasmons, in order to generate enhanced electric fields in the vicinity of metal manoparticles, the metal nanoparticles must be enclosed in a material having a high refractive index such as silicon after coating them with a material having a low refractive index such as glass. In addition to the reason described above, such a requirement further reduces the size of areas of a sensor such as a photodiode where electrons contributing to sensitivity can be generated from enhanced electric fields in practice, i.e., areas where effective light exits and where integrated sensitivity can be calculated. Therefore, light enhanced by plasmons may not reach the photodiode which performs photoelectric conversion.

According to the related art, despite the trend toward sensors having higher sensitivity and a smaller thickness, it has not been possible to obtain conduction electrons to serve as signals of such sensors by directly observing light enhanced by plasmons generated as a result of a resonance phenomenon. Instead, it has been required to perform processes which are physically difficult to execute, e.g., detection of reemitted light from resonators and extension of the detection time of a photodiode.

Under the above-described circumstance, it is desirable to provide a semiconductor device which utilizes surface plasmons and which can be provided with a photoelectric conversion layer having higher sensitivity and a smaller thickness.

It is also desirable to provide an electronic apparatus provided with a solid-state imaging device composed of the semiconductor device and capable of being applied to a camera and the like.

According to an embodiment of the invention, there is provided a semiconductor device including a photoelectric conversion layer, a continuous or discontinuous cylindrical metal microstructure embedded in the photoelectric conversion layer, and dielectric films with which an inner side surface and an outer side surface of the metal microstructure are coated.

In the semiconductor device according to the embodiment of the invention, surface plasmons are generated by the cylindrical metal microstructure when light enters the device, and enhanced electric fields and hence intense light is directly generated in wide areas in the photoelectric conversion layer inside and outside the cylindrical metal microstructure. Since the metal microstructure has a cylindrical shape, reflection of light incident on the metal microstructure is suppressed, and energy of the light can therefore be efficiently converted into electrical charges.

According to another embodiment of the invention, there is provided an electronic apparatus including an optical lens, a semiconductor device formed as a solid-state imaging device, and a signal processing circuit processing a signal output by the semiconductor device. The semiconductor device includes an imaging region formed by an array of a plurality of pixels. Each of the plurality of pixels includes a plurality of continuous or discontinuous cylindrical metal microstructures embedded in a photoelectric conversion layer thereof and dielectric films with which an inner side surface and an outer side surface of the metal microstructures are coated.

Since the electronic apparatus according to the embodiment of the invention includes the semiconductor device formed as a solid-state imaging device, the energy of incident light can be efficiently converted into signal charges at the photoelectric conversion layer of the solid-state imaging device.

In the semiconductor device according to the embodiment of the invention, the cylindrical metal microstructures allow intense light to be generated in wide areas in the photoelectric conversion layer. The metal microstructures have a low reflectance, and the energy of light can therefore be efficiently converted into signal changes. Thus, the photoelectric conversion layer can be provided with high sensitivity and a small thickness.

According to the embodiment of the invention, an electronic apparatus having a smaller thickness and improved sensitivity can be obtained because the semiconductor device formed as a solid-state imaging device is provided as described above.

BRIEF DESCRIPTION OF THE DRAWINGS

FIGS. 9A to 9G are illustrations of cylindrical patterns which are exemplary shapes that a cylindrical metal microstructure may have when viewed from above;

FIGS. 11A and 11B are schematic illustrations of a configuration of major parts of a second embodiment of the invention that is a semiconductor device according to the invention used as a solid-state imaging device;

DESCRIPTION OF PREFERRED EMBODIMENTS

Modes for implementing the invention (herein after referred to as embodiments) will be described below in the following order.

1. First Embodiment (Examples of Schematic Basic Configuration and Manufacturing Method of Semiconductor Device)

2. Second Embodiment (Exemplary Schematic Configuration of Major Parts of Semiconductor Device Used as Solid-State Imaging Device)

3. Third Embodiment (Exemplary Schematic Configuration of Semiconductor Device used as Solar Battery)

4. Fourth Embodiment (Exemplary Configuration of Electronic Apparatus)

1. First Embodiment

Example of Schematic Basic Configuration of Semiconductor Device

Figure 1A:
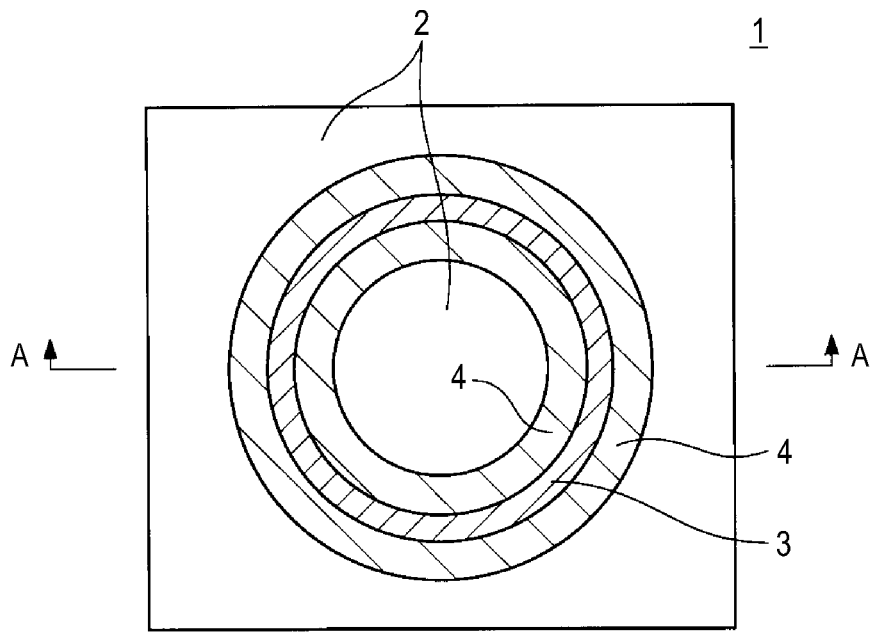
FIG. 1A is a plan view of a semiconductor device according to an embodiment of the invention (first embodiment) showing a basic configuration thereof.
Figure 1B:
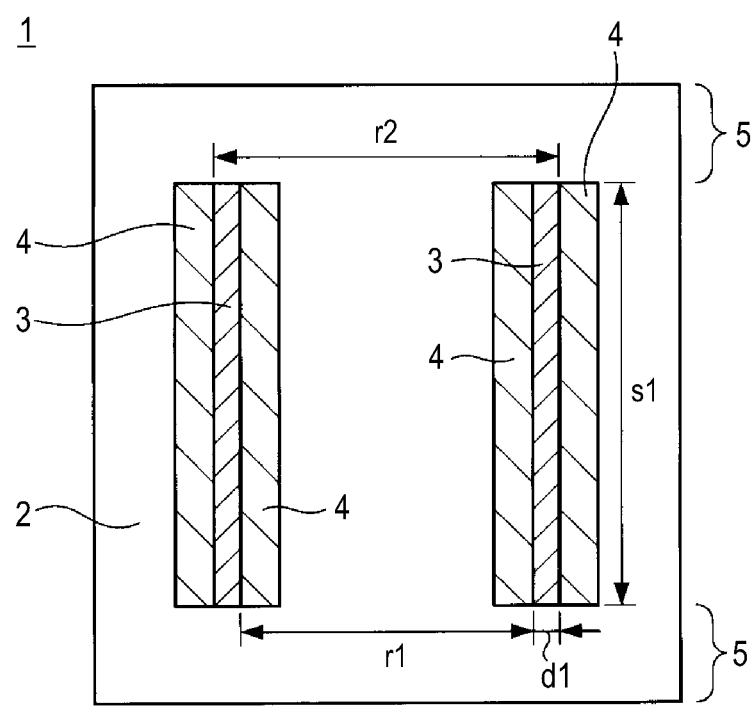
FIG. 1B is a sectional view taken along the line A-A in FIG. 1A.

FIGS. 1A and 1B show a first embodiment of a semiconductor device according to the invention. The first embodiment represents a schematic basic configuration of a semiconductor device according to the invention. As shown in FIGS. 1A and 1B, a semiconductor device 1 according to the first embodiment of the invention is formed by embedding continuous or discontinuous cylindrical metal microstructures 3 in a semiconductor substrate 2, which may be made of silicon, to serve as a photoelectric conversion layer. Inner and outer surfaces of the metal microstructures 3 are coated with dielectric films 4. When light impinges on the metal microstructures 3, surface plasmons are excited on the metal microstructures.

In order to cause the excitation of surface plasmons, the metal microstructures 3 must be formed from a metal material which has a negative dielectric constant when coupled with light. The metal microstructures 3 are formed from a metal material which satisfies such a requirement, e.g., gold (Au), silver (Ag), copper (Cu), aluminum (Al), or tungsten (W). Although tungsten (W) does not have a negative dielectric constant when coupled with light having the wavelengths of green, it may have a negative dielectric constant depending on the waveband of light that is coupled.

The dielectric films 4 covering the metal microstructures 3 are formed from a material having a lower refractive index. The dielectric films 4 are preferably formed from a dielectric material having a refractive index whose real part is 3.0, e.g., $SiO_2$, SiON, or $HfO_2$. The dielectric films 4 of the present embodiment are silicon oxide ($SiO_2$) films. In the case of a material having a refractive index whose real part exceeds 3.0, no sufficient electric field will be formed.

The cylindrical metal microstructures 3 preferably have an inner diameter r1 or inner length t1 when viewed from above (see FIG. 9E) which is set within the range from 100 nm to 1.0 μm, a thickness d1 which is set within the range from 10 nm to 100 nm, and a total length s1 which is set within the range from 20 nm to 3.0 μm. For example, when the metal microstructures 3 have a square cylindrical shape as shown in FIG. 9D or 9E which will be described later, the inner length t1 of the square shape is preferably set within the range from 100 nm to 1.0 μm.

When the inner diameter r1 or inner length t1 is within the range from 100 nm to 1 μm, surface plasmons can be excited by visible light. A diameter or inner length out of this range does not satisfy the requirement for exciting surface plasmons with visible light. When the inner diameter r1 or inner length t1 is within the range from 100 nm to 300 nm, surface plasmons can be reliably excited by visible light. Preferably, the metal microstructures 3 have an outer diameter r2 which is equal to or smaller than the wavelength of light incident on the same. When the thickness d1 is smaller than 10 nm, a problem can arise in that light penetrates through the metal microstructures. When the thickness is in the excess of 100 nm, a problem can arise in that the reflectance of light becomes excessively high. When the length s1 is smaller than 20 nm, a problem can arise in that surface plasmons will reside in undesirably small areas. When the thickness is in the excess of 3.0 μm, a problem also arises in that the great thickness makes only small contribution to sensitivity.

In the present embodiment of the invention, light transmitting layers 5 made of the same material as the photoelectric conversion layer are formed to coat top and bottom surfaces of the metal microstructures 3. In the present embodiment, the light transmitting layers 5 are formed as part of the semiconductor substrate 2. Surface plasmons can be generated in response to light having a particular wavelength by adjusting the diameter of the cylindrical metal microstructures 3 or the outer length of the microstructures measured by viewing the microstructure from above.

Figure 6:
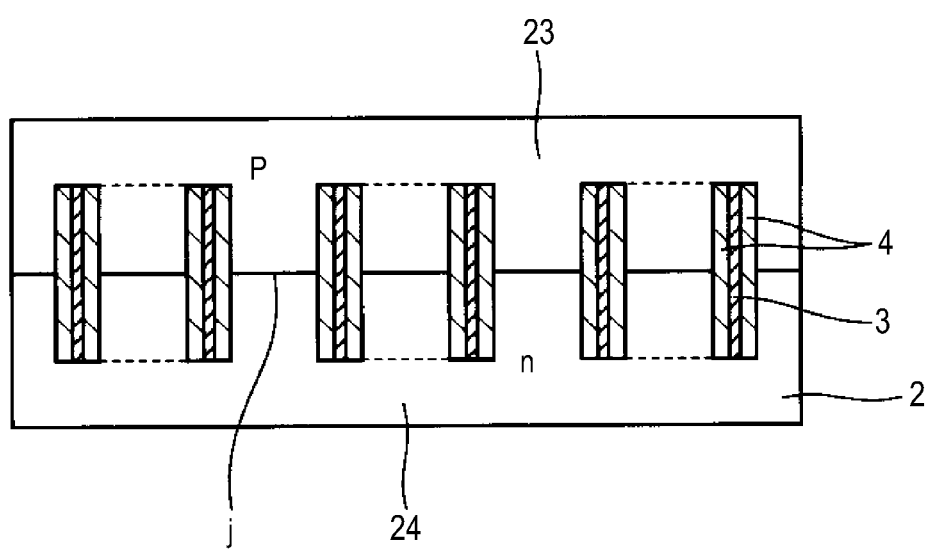
FIG. 6 is an illustration of a configuration of a semiconductor device for explaining another exemplary readout method.

In the present embodiment, as shown in FIG. 6, a p-n junction j may be provided in the semiconductor substrate 2 by forming a semiconductor region of a first conductivity type (p-type or n-type) and a semiconductor region of a second conductivity type (n-type or p-type) in the same according to a signal readout method used which will be described later. The p-n junction j is formed so as to extend across the cylindrical microstructures 3 in the middle of the microstructures when viewed in the longitudinal direction thereof.

Example of Method of Manufacturing Semiconductor Device

Figure 2A:
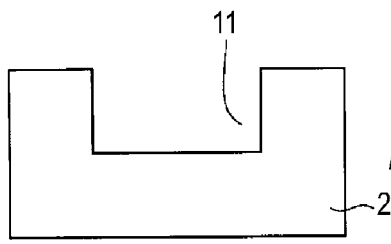
FIGS. 2A to 2J are illustrations of manufacturing steps showing an example of a method of manufacturing the semiconductor device according to the first embodiment.

FIGS. 2A to 2J illustrate an example of a method of manufacturing a semiconductor device 1 according to the first embodiment of the invention. As shown in FIG. 2A, a semiconductor substrate 2 to serve as a photoelectric conversion layer is first formed from, for example, silicon single crystals. A recess 11 having a required diameter is formed to a required depth from the surface of the semiconductor substrate 2.

Figure 2F:
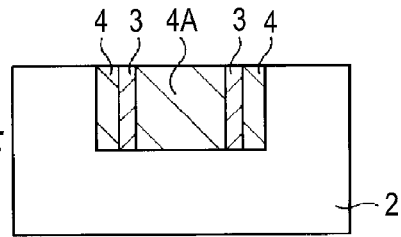
Figure 2B:
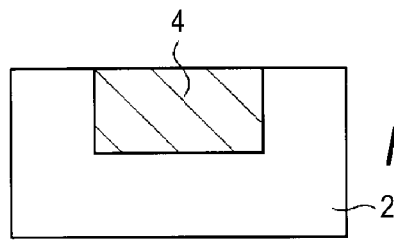
Figure 2G:
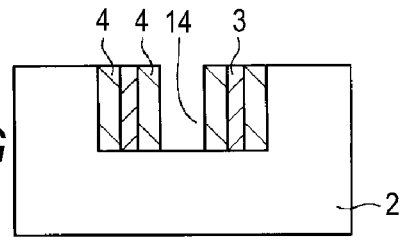
Figure 2C:
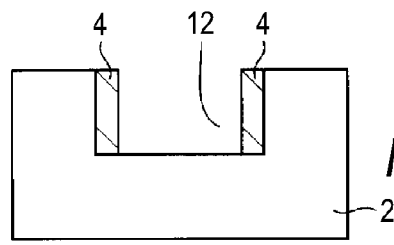

Next, as shown in FIG. 2B, a dielectric film 4 which may be a silicon oxide film is embedded in the recess 11. Next, as shown in FIG. 2C, the dielectric film 4 is selectively etched such that part of the film remains with a required thickness on the sidewall of the recess 11.

Figure 2H:
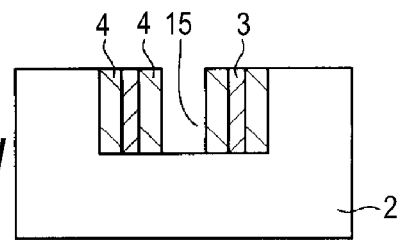
Figure 2D:
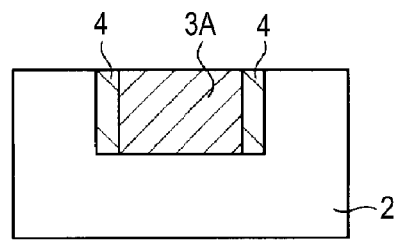

Next, as shown in FIG. 2D, a metal layer, e.g., an aluminum (Al) layer 3A, which is to be formed into a metal microstructure, is embedded in a recess 12 formed as a result of the etching. Next, the aluminum layer 3A is selectively etched to form a cylindrical metal microstructure 3, as shown in FIG. 2E.

Next, as shown in FIG. 2F, a dielectric film 4A, which may be a silicon oxide film, is embedded in a recess 13 formed by removing a central part of the aluminum layer 3A. Next, as shown in FIG. 2G, the dielectric film 4A is selectively etched such that another dielectric film 4 having a required thickness remains in contact with an inner surface of the metal microstructure 3.

Next, as shown in FIG. 2H, a semiconductor layer 15 made of silicon single crystals is formed in a recess 14 formed by removing a central part of the dielectric film 4A to fill the recess 14. The semiconductor layer 15 is a semiconductor layer which is equivalent to the semiconductor substrate 2 in characteristics including conductivity type. Thus, the semiconductor layer is formed as part of the semiconductor substrate 2.

Figure 2I:
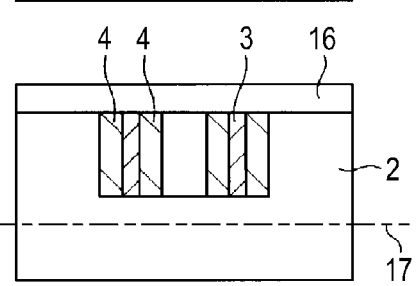
Figure 2E:
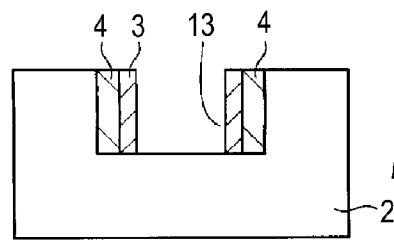

Next, as shown in FIG. 2I, a semiconductor layer 16 made of silicon single crystals is formed on the semiconductor substrate 2 which includes the metal microstructure 3, the dielectric films 4, and the semiconductor layer 15. The semiconductor layer 16 is a semiconductor layer which is equivalent to the semiconductor substrate 2 in characteristics including conductivity type. Thus, the layer is formed as part of the semiconductor substrate 2. The semiconductor layer 16 corresponds to the light transmitting layer 5 shown in FIG. 1B.

Figure 2J:
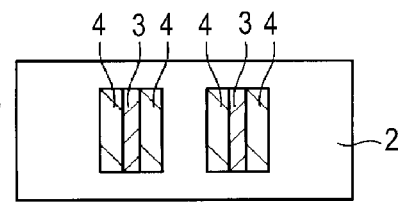

Next, as shown in FIG. 2J, for example, a CMP (chemical mechanical polishing) process is then performed on the bottom surface of the semiconductor substrate 2 to remove part of the substrate up to the position 17 (shown in FIG. 2I) indicated by a chain line to leave the substrate with a certain thickness, the remaining part serving as a light transmitting layer 5. The removing process utilizing CMP may be performed with a support substrate attached to the top surface of the semiconductor substrate 2. Thus, a semiconductor device 1 is obtained as desired.

When electrodes are to be formed according to the signal readout method which will be described later, the step shown in FIG. 2J is followed by the step of forming a pair of electrodes on the top and bottom surfaces of the semiconductor substrate 2, the electrodes including a transparent electrode. When a p-n junction is to be formed, the semiconductor substrate 2 is formed as a substrate of a first conductivity type (p-type or n-type), and a p-n junction is formed by implanting ions of an impurity of a second conductivity type (n-type or p-type) after the step shown in FIG. 2J is performed.

Figure 4A:
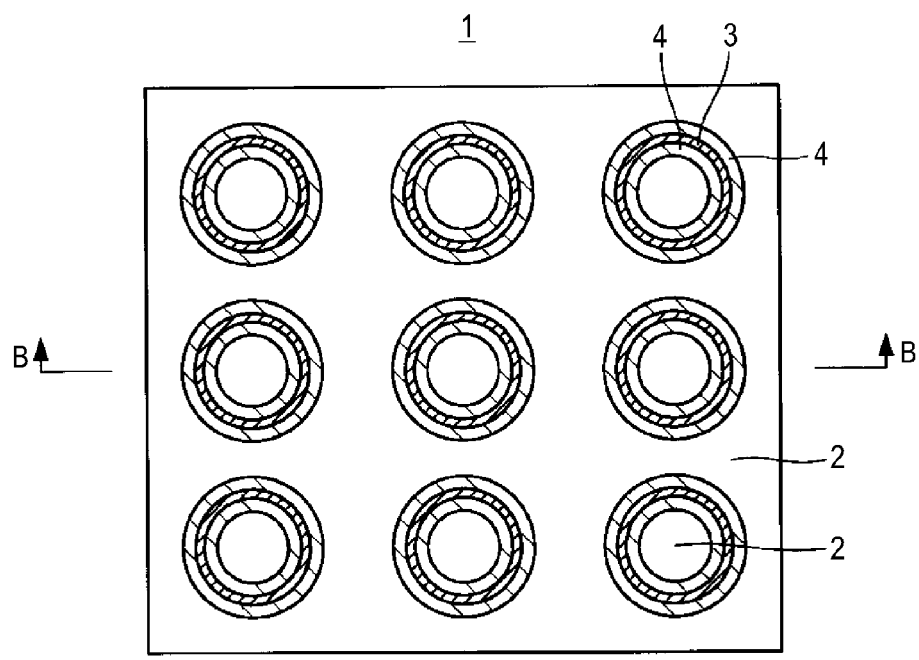
FIG. 4A is a plan view of another example of a semiconductor device according to the first embodiment.
Figure 4B:
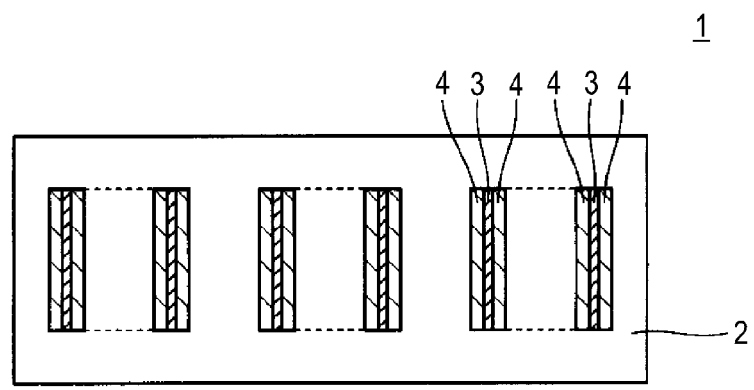
FIG. 4B is a sectional view taken along the line B-B in FIG. 4A.

As shown in FIGS. 4A and 4B, the semiconductor device according to the first embodiment may be formed by periodically disposing a plurality of the metal microstructures 3 in the semiconductor substrate 2. In the present embodiment, the metal microstructures 3 are periodically provided to form an array of nine microstructures in total, the array having three each columns and rows of microstructures when viewed from above.

Description of Operations of Semiconductor Device

Figure 3:
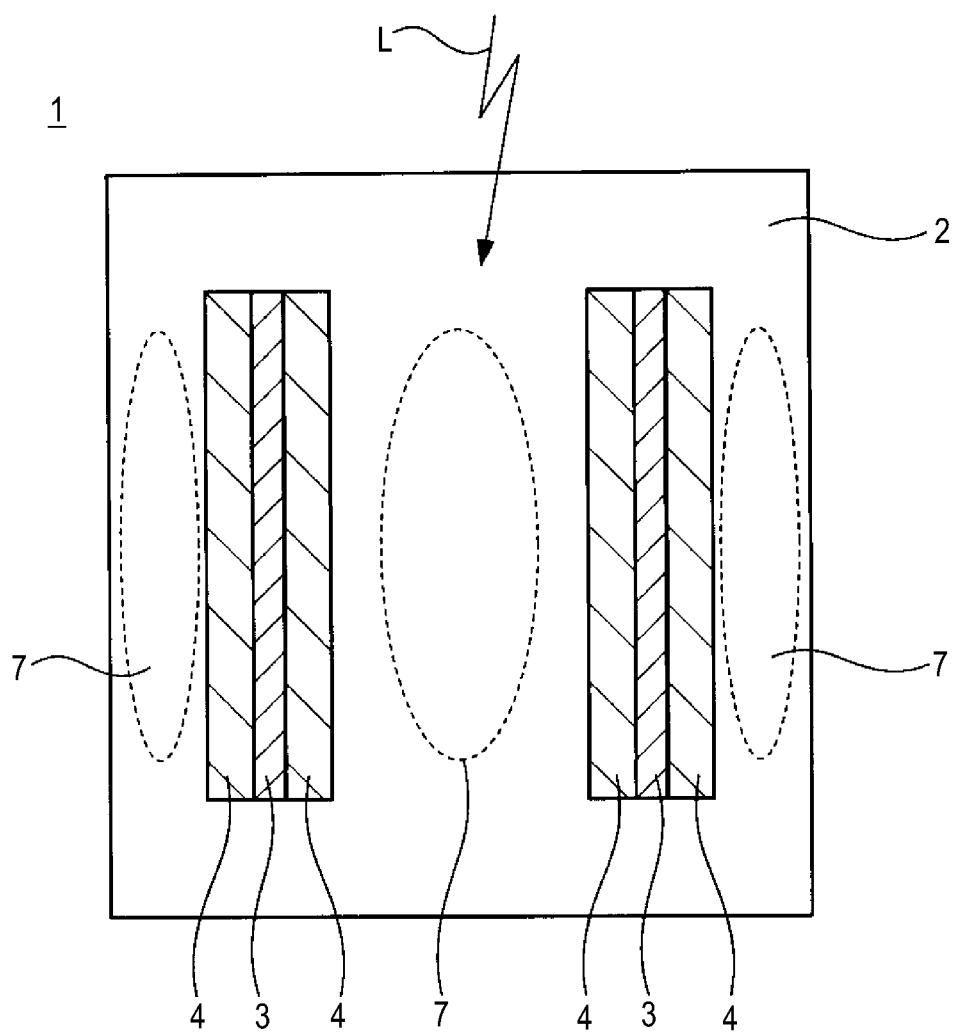
FIG. 3 is an illustration for explaining operations of a semiconductor device according to the embodiment of the invention.

Operations of the semiconductor device 1 according to the first embodiment of the invention will now be described. As shown in FIG. 3, when light L impinges on a metal microstructure 3 through the semiconductor substrate 2 which is a photoelectric conversion layer, the microstructure undergoes plasmon resonance with light beams having particular wavelengths. Thus, surface plasmons are excited. Intense light beams enhanced by the surface plasmons are directly excited in regions 7 which are located inside and outside the cylindrical metal microstructure 3 and in the middle of the microstructures when viewed in the longitudinal direction thereof. Such regions 7 where intense light is excited are formed in wide areas of the photoelectric conversion layer. That is, electric fields enhanced by surface plasmons are directly excited in wide areas. Although the surface plasmons generated by the cylindrical metal microstructures 3 are smaller than localized plasmons in terms of the magnitude of peaks, great electromagnetic fields are concentrated and accumulated inside and outside the cylindrical structures. As a result, photoelectric conversion takes place in semiconductor regions occupying a great volume located inside and outside the cylindrical metal microstructures 3. Electric charges generated as a result of the photoelectric conversion are used as signals.

When the metal microstructures 3 are coated with the dielectric films 4 having a low dielectric constant and embedded in the semiconductor substrate 2 to serve as a photoelectric conversion layer made of, for example, silicon which has a high refractive index, intense electric fields can be efficiently generated by exciting surface plasmons. That is, light having high optical intensity can be generated efficiently.

Figure 5:
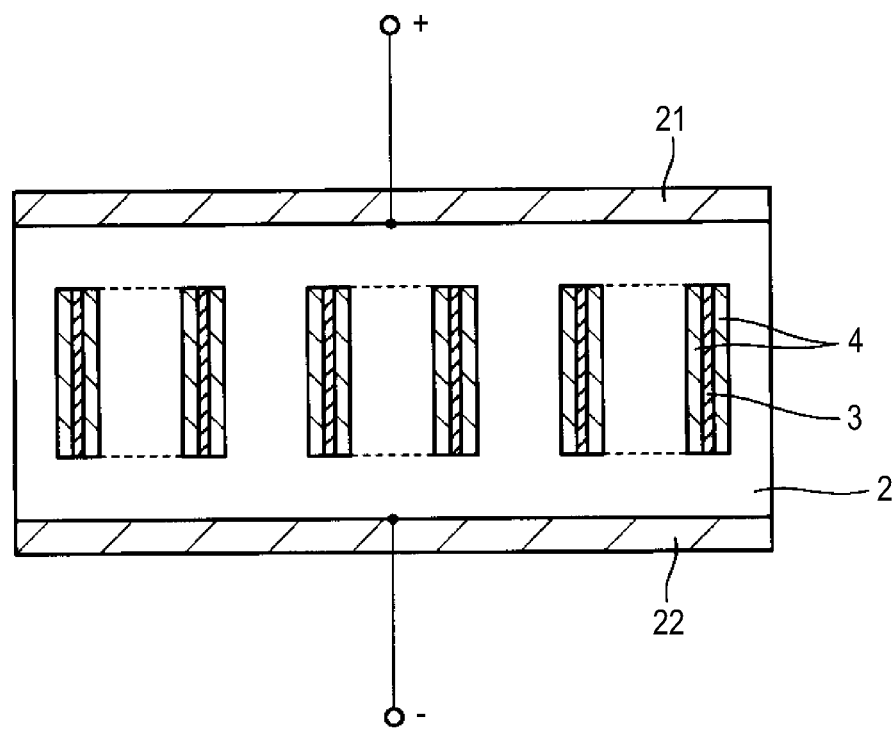
FIG. 5 is an illustration of a configuration of a semiconductor device for explaining an exemplary readout method.

For example, a signal readout method as shown in FIG. 5 may be used. Referring to FIG. 5, electrodes 21 and 22 are formed on top and bottom surfaces of the semiconductor substrate 2 to serve as a photoelectric conversion layer. A potential difference is applied between the electrodes 21 and 22 from outside to form an electric field in the semiconductor substrate 2. Electrons which have been excited by optical energy from the valance band into the conduction band are read out as signals. At least either of the electrodes 21 and 22 is a transparent electrode, whichever is located on the light entering side of the device. A signal readout method as shown in FIG. 6 may alternatively be used. Referring to FIG. 6, an n-type semiconductor layer 23 and a p-type semiconductor layer 24 are formed in the semiconductor substrate to serve as a photoelectric conversion layer, whereby a p-n junction is formed in the substrate. Electric charges generated as a result of photoelectric conversion are thus accumulated and readout as signals. The impurity density of the semiconductor layers 23 and 24 and the design of the regions occupied by the layers depend on the shape of the metal microstructures 3.

Figure 7:
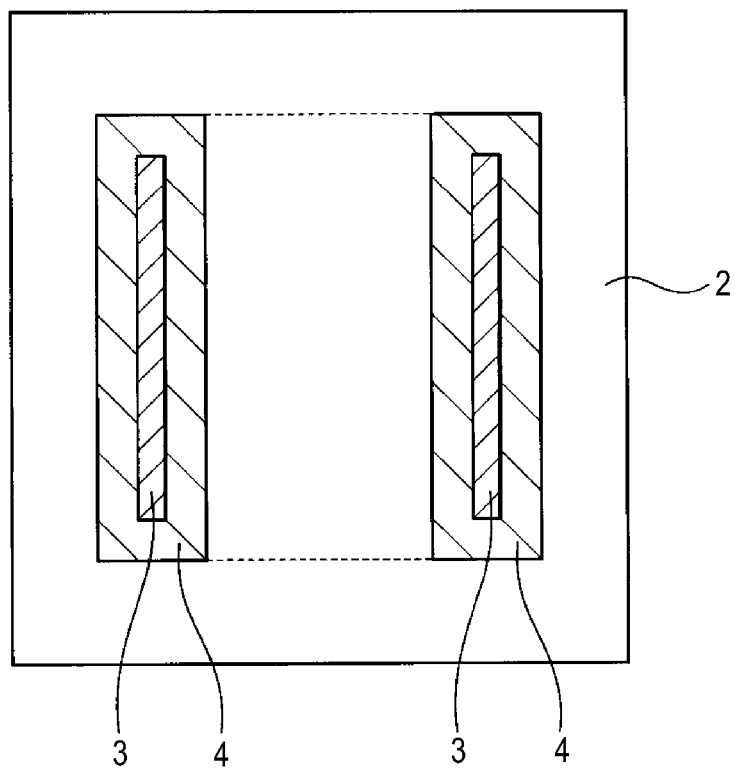
FIG. 7 is a schematic sectional view of another example of a semiconductor device according to the first embodiment of the invention.
Figure 8:
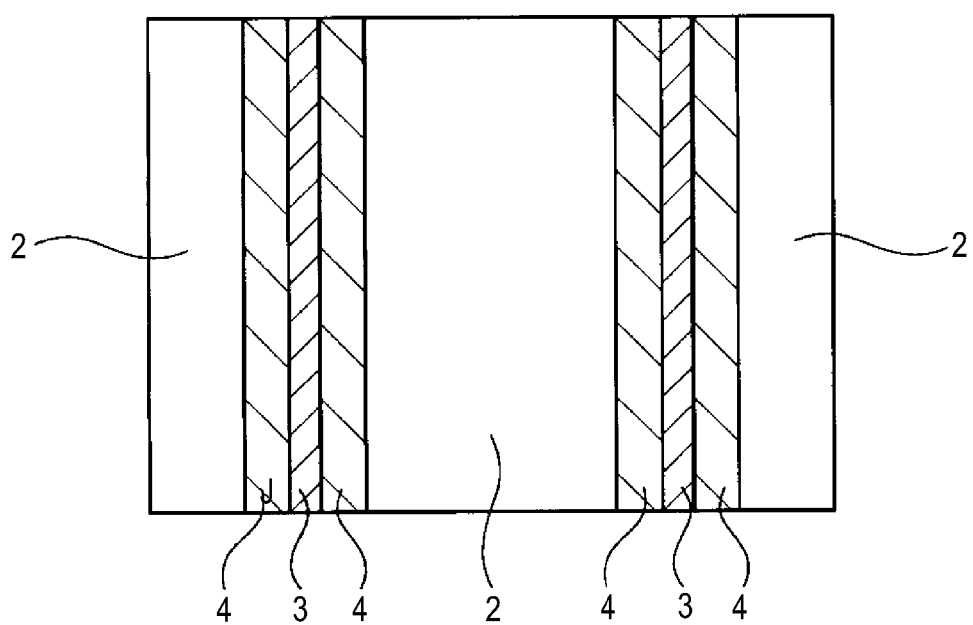
FIG. 8 is a schematic sectional view of still another example of a semiconductor device according to the first embodiment of the invention.

FIGS. 7 and 8 show modifications of the semiconductor device 1 according to the first embodiment of the invention. In a semiconductor device 26 shown in FIG. 7, top and bottom end surfaces of a cylindrical metal microstructure 3 are also coated with dielectric films 4 made of the same material as dielectric films 4 provided on inner and outer side surfaces of the structure. That is, the entire surface of the metal microstructure 3 is coated with the dielectric films 4. The configuration of the modification is otherwise identical to the configuration shown in FIGS. 1A and 1B. Elements of the modification which have corresponding elements in FIGS. 1A and 1B are therefore indicated by the same reference numerals as used in FIGS. 1A and 1B, and such elements will not be described to avoid duplication. It is preferable to coat the top end surface of the metal microstructure 3 with the dielectric film 4 because a more intense electric field can be generated.

A semiconductor device 27 shown in FIG. 8 has a configuration identical to the configuration shown in FIGS. 1A and 1B except that the light transmitting layers 5 are omitted to expose the metal microstructures 3 on the top and bottom surfaces of the semiconductor substrate 2. The configuration is otherwise identical to the configuration described with reference to FIGS. 1A and 1B. Therefore, elements of the modification which have corresponding elements in FIGS. 1A and 1B are indicated by the same reference numerals as used in FIGS. 1A and 1B, and such elements will not be described to avoid duplication. A more intense electric field can be generated in the semiconductor device 27 because there is no light transmitting layer 5. Thus, more electrons can be excited.

In the above-described semiconductor device 1 according to the first embodiment of the invention, the metal microstructures 3 for exciting surface plasmons are formed in a cylindrical shape and embedded in the semiconductor substrate 2 to serve as a photoelectric conversion layer. Since the metal microstructures 3 have a cylindrical shape, the metal microstructures 3 have a small sectional area when viewed in the horizontal direction which is perpendicular to the travelling direction of light. Therefore, the reflectance at the metal microstructures 3 is low. That is, reflection of light at the metal microstructures 3 is suppressed, which allows reduction in the flux of light into the photoelectric conversion layer to be minimized. As a result, the generation of electrons contributing to sensitivity will not be hindered, and the energy of light can therefore be efficiently converted into signals.

According to the related art, localized plasmons generated by nanoparticles reside in very small areas. On the contrary, propagating plasmons generated by the cylindrical metal microstructures 3 according to the present embodiment allow great electromagnetic fields to be concentrated and accumulated inside and outside the cylindrical structures, although propagating plasmons are less advantageous in terms of the magnitude of local peaks. That is, intense light can be concentrated and accumulated inside and outside the cylindrical structures. Thus, photoelectric conversion can be induced in areas occupying a great volume inside the cylindrical structures and around the exterior of the cylindrical structures. As a result, light can be subjected to photoelectric conversion in elevated positions around the cylindrical structures, whereas such conversion has taken place in deeper positions of a photoelectric conversion layer according to the related art. Therefore, a photoelectric conversion layer or a sensor can be provided with a smaller thickness.

According to the preset embodiment, when light beams having different wavelengths, e.g., red, green, and blue light beams are to be enhanced, the simplest way to achieve the enhancement is to adjust the diameter of the cylindrical microstructures 3 or the outer length of the microstructures measured when the microstructures are viewed from above. Since the cylindrical microstructures 3 are made of an inorganic metal material, they have high durability. Further, light is controlled by the construction of the metal microstructures 3 rather than the characteristics of the material from which the metal microstructures 3 are made. Therefore, designing can be carried out with freedom to achieve desired characteristics.

According to the present embodiment, electric fields enhanced by surface plasmons can be directly generated in wide areas in a region of the sensor where signals can be detected. Therefore, light can be converted into signals using an ordinary detection method in the related art without relying on physical mechanisms such as "reemission" and "delay of detection time" to which not so much attention has been paid in the field of image sensors.

In order to confirm those advantages, a simulation was carried out using a semiconductor device 1 as shown in FIGS. 1A and 1B and light having a wavelength of 600 nm. As a result, it was confirmed that enhanced electric fields are directly generated in silicon regions which are located in the middle of the device inside and outside the cylindrical metal microstructures 3 and in which signals can be detected. A comparison of peaks of electric field intensity has revealed that the use of the metal microstructures 3 provides a peak value of 13 whereas a peak value achievable in bulk silicon is 1. It was therefore confirmed that the use of the metal microstructures 3 is obviously effective in generating a higher electric intensity in terms of peak values. Sensitivity can be evaluated from an integrated value obtained in the photoelectric conversion layer. A comparison of integrated sensitivity has revealed that a 250 nm thick silicon semiconductor substrate 2 including cylindrical metal microstructures 3 embedded therein has sensitivity equivalent to that of bulk silicon having a thickness of 700 nm. Although a comparison result obtained using light having the wavelengths of red is shown, the substrate exhibits similar sensitivity to light in the green and blue wavebands.

When an optical absorption peak at each wavelength is to be controlled by selecting the metal material appropriately and controlling the shape and size of the material, manufacturing accuracy is important. When metal nanoparticles according to the related art are used, dimensional variation must be controlled on the order of several tens nm. On the contrary, the cylindrical metal microstructures 3 of the present embodiment can be manufactured under less strict requirements on the control of manufacture variation because the microstructures have dimensions on the order of several hundred nm in terms of the diameter or outer length viewed from above and the length in the depth direction thereof.

FIGS. 9A to 9G and FIGS. 10A to 10G show examples of shapes in which the cylindrical metal microstructures 3 (along with the dielectric films 4) may be formed. FIGS. 9A to 9G show ring-like patterns that a cylindrical metal microstructure 3 may have when viewed from above.

A metal microstructure 3 coated with dielectric films 4 shown in FIG. 9A is formed in a cylindrical shape having a continuous circular section.

A metal microstructure 3 coated with dielectric films 4 shown in FIG. 9B is formed in a cylindrical shape having a circular section including a cutout 29 in part thereof which makes the section discontinuous as a whole.

A metal microstructure 3 coated with dielectric films 4 shown in FIG. 9C is formed in a cylindrical shape having a circular section including cutouts 29 provided at equal angular intervals, four divisions of the section defined by the cutouts collectively forming a discontinuous circular section.

A metal microstructure 3 coated with dielectric films 4 shown in FIG. 9D is formed in a square cylindrical shape which is square when viewed from above.

A metal microstructure 3 coated with dielectric films 4 shown in FIG. 9E is formed in a square cylindrical shape having a square section divided into two equal parts by cutouts 29, the divisions collectively forming a discontinuous square section.

A metal microstructure 3 coated with dielectric films 4 shown in FIG. 9F is formed in a continuous elliptical cylindrical shape having a circular center hole, an outer dielectric film 4 of the microstructure having a horizontally elongated elliptical sectional shape, the metal microstructure 3 itself and another dielectric film 4 inside the microstructure having a vertically elongated elliptical sectional shape.

A metal microstructure 3 coated with dielectric films 4 shown in FIG. 9G is formed by coaxially disposing a plurality of metal microstructures (two metal microstructures 3A and 3B in this example) with predetermined gaps kept between them.

FIGS. 10A to 10G show cylindrical patterns or sections of cylindrical metal microstructures 3 taken in the vertical direction.

Figure 10A:
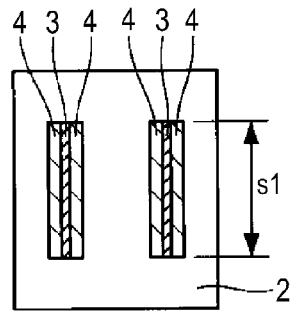
FIGS. 10A to 10G are illustrations of cylindrical patterns which are exemplary vertical sectional shapes that a cylindrical metal microstructure may have.

A metal microstructure 3 coated with dielectric films 4 shown in FIG. 10A is formed in a continuous cylindrical shape having a diameter kept unchanged in the longitudinal direction.

Figure 10E:
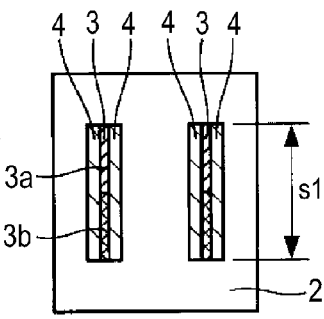
Figure 10B:
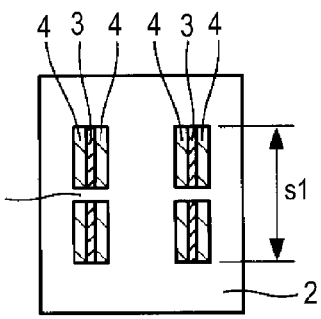
Figure 10F:
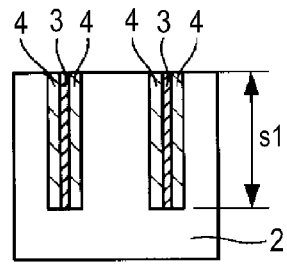

A metal microstructure 3 coated with dielectric films 4 shown in FIG. 10B is formed in a cylindrical shape which is made discontinuous by being dividing into two parts by a cutout 30 in the longitudinal direction thereof.

Figure 10C:
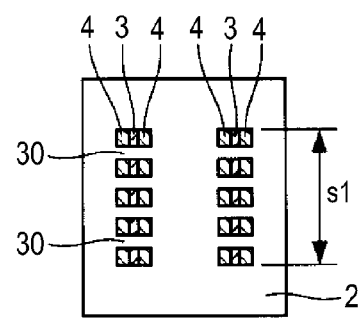

A metal microstructure 3 coated with dielectric films 4 shown in FIG. 10C is formed in a cylindrical shape which is made discontinuous by being divided into a multiplicity of parts (five parts in the present embodiment by cutouts 30 in the longitudinal direction thereof.

Figure 10G:
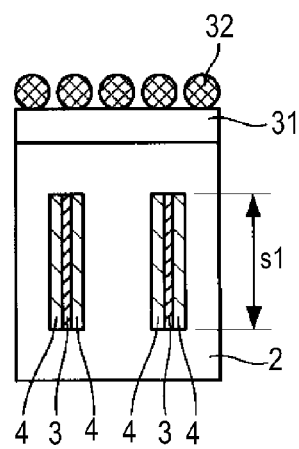
Figure 10D:
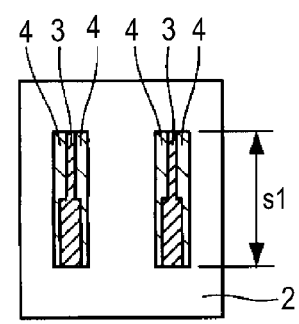

A metal microstructure 3 coated with dielectric films 4 shown in FIG. 10D is formed in a cylindrical shape in which the metal microstructure 3 is longitudinally divided into two parts having different thicknesses t1 and t2. For example, the metal microstructure 3 is formed from the same metal material such that the half of the structure opposite to a light-entering side thereof has the thickness t2 which is greater than the thickness t1 of the half of the structure on the light-entering side.

A metal microstructure 3 coated with dielectric films 4 shown in FIG. 10E is divided in the longitudinal direction into two parts. For example, one of the parts, i.e., a part 3a is formed from aluminum (Al), and another part, i.e., a part 3b is formed from silver (Ag).

A metal microstructure 3 coated with dielectric films 4 shown in FIG. 10E has a cylindrical shape which is continuous in the longitudinal direction thereof. The metal microstructure 3 is formed with no light transmitting layer 5 such that the top surface of the microstructure is exposed.

A metal microstructure 3 coated with dielectric films 4 shown in FIG. 10G is a cylindrical microstructure embedded in a semiconductor substrate 2 on which a plurality of metal nanoparticles 32 are arranged with a dielectric film, e.g., a silicon oxide ($SiO_2$) film 31 interposed.

The metal microstructure 3 coated with dielectric films 4 of the present embodiment may be formed as a combination of any of the plan view patterns shown in FIGS. 9A to 9G and any of the vertical sectional patterns shown in FIG. 10A to 10G.

The above-described semiconductor device 1 according to the first embodiment may be used as a solid-state imaging device, e.g., an area image sensor or a linear image sensor, a solar battery, or a biosensor.

2. Second Embodiment

Exemplary Schematic Configuration of Major Parts of Semiconductor Device Used as Solid-State Imaging Device FIGS. 11A and 11B show a second embodiment of the invention that is a semiconductor device according to the invention used as a solid-state imaging device. FIGS. 11A and 11B show a photoelectric conversion section (light-receiving sensor section) that is a major part of the solid-state imaging device. The solid-state imaging device of the present embodiment may be used as a CMOS solid-state imaging device, a CCD solid-state imaging device, or a line sensor.

A solid-state imaging device 35 according to a second embodiment of the invention includes an imaging region 37 that is an array of a plurality of pixels 36 (36R, 36G, and 36B). The plurality of pixels 36 have a photoelectric conversion portion 38 which is formed by embedding a plurality of cylindrical metal microstructures 3 in a semiconductor substrate 2 made of, for example, silicon to serve as a photoelectric conversion layer as described above. The semiconductor substrate 2 (hereinafter referred to as "photoelectric conversion layer") may have a configuration including a p-n junction j as shown in FIG. 6 or a configuration including no p-n junction as shown in FIG. 5 depending on the electric charge readout method used. In this embodiment, the substrate has a configuration including a p-n junction j. When electrons are used as signal charges, the photoelectric conversion portion 38 is formed as a photodiode having a p-n junction j formed by an n-type semiconductor region 41 and a p-type semiconductor region 42 to serve as charge accumulation regions. The p-n junction j is formed to extend across the metal microstructures 3 in the middle of the microstructures when viewed in the longitudinal direction thereof. That is, the p-n junction j is formed to extend across the metal microstructures 3 in the position halving the length of the microstructures. Inner and outer side surfaces of the cylindrical metal microstructures 3 are coated with dielectric films 4. The configurations of the metal microstructures 3 and the dielectric films 4 are the same as described above. Therefore, the configurations will not be described to avoid duplication. For example, the plurality of pixels 36 is constituted by red pixels 36R, green pixels 36G, and blue pixels 36B. The red pixels 36R, green pixels 36G, and blue pixels 36B may be arranged in the form of a Bayer array, a honeycomb array, or the like. Preferably, light-blocking portions 39 are provided between the pixels 36 to prevent light from entering a pixel from adjoining pixels.

It is assumed that the size of the period at which the cylindrical metal microstructures 3 are disposed is equal to or smaller than the pixel size. It is therefore desirable to embed the cylindrical metal microstructures 3 in the pixels 36 such that the microstructures are provided in a maximum density with the periodic structure maintained. For example, when the size of the period of the cylindrical metal microstructures 3 is about ⅓ of the size of one pixel, the microstructures are arranged in the form of arrays having three each rows and columns as seen in the pixel 36R. The arrangement of the metal microstructures 3 and the diameter (outer length) of the cylindrical shape of the microstructures depend on the wavelength of light to be enhanced. Therefore, the arrangement and the diameter relate to color filters provided on the photodiode. There is a tendency as described below. When light having a short wavelength such as blue light is to be enhanced, the cylindrical metal microstructures 3 have a small diameter (outer length), and the period at which the metal microstructures 3 are disposed is also small. When light having a longer wavelength such as red light is to be enhanced, the cylindrical metal microstructures 3 have a greater diameter r2, and the period at which the metal microstructures 3 are disposed is also greater.

In the present embodiment, the diameter r2 or outer length t2 of the metal microstructures 3 (including the dielectric films 4) in the photoelectric conversion portions 38 of the pixels 36 is set at different values in the red pixels 36R, the green pixels 36G, and the blue pixels 36B, the values descending in the order in which the color pixels are listed. In this example, the different sizes of the microstructures will be compared in terms of the diameter r2. Specifically, when it is assumed that the metal microstructures 3 have diameters r21, r22, and r23 in the red pixels 36R, the green pixels 36G, and the blue pixels 36B respectively, the diameters are set such that an expression "r21>r22>r23" holds true. The diameter r23 of the metal microstructures 3 in the blue pixels 36B may be about 150 nm. Color filters (not shown) are disposed opposite to the red pixels 36R, the green pixels 36G, and the blue pixels 36B.

A CCD solid-state imaging device includes a plurality of photoelectric conversion portions (photodiodes) to serve as pixels regularly arranged in the form of two-dimensional array, a vertical transfer register having a CCD structure associated with each of the photoelectric conversion portions, a horizontal transfer register having a CCD structure, and an output section, provided in an imaging region thereof.

When the present embodiment is used as a CCD solid-state imaging device, the photodiode at each pixel of such an imaging device is replaced with a photodiode having metal microstructures 3 (including dielectric films 4) as described above embedded therein. Color filters and on-chip lenses are provided above the imaging region.

A CMOS solid-state imaging device includes an imaging region in which a plurality of pixels are regularly arranged in the form of a two-dimensional array and a peripheral circuit section. Unit pixels each having one photodiode serving as a photoelectric conversion portion and a plurality of pixel transistors may be used as the pixels. The pixels may be formed using the so-called pixel shared structure in which pixel transistors other than transfer transistors are shared by a plurality of photoelectric conversion portions. The plurality of pixel transistors of a unit pixel may be constituted by three transistors, i.e., a transfer transistor, a reset transistor, and an amplification transistor. Alternatively, a selection transistor may be added to use four transistors in total.

When the present embodiment is used as a CMOS solid-state imaging device, the photodiodes at the pixels of such an imaging device is replaced with photodiodes having metal microstructures 3 (including dielectric films 4) as described above embedded therein. Color filters and on-chip lenses are provided above the imaging region.

In the present embodiment, since light enhanced by the plasmon effect is directly generated at photodiodes (a sensor) as described above, a readout operation can be performed in an ordinary manner. Therefore, electrical charge is read out using a p-n junction, an electrode, or a transparent electrode in the same manner as shown in FIG. 5 or 6.

When the present embodiment is used as a so-called line sensor in which pixels are linearly arranged in the form of a one-dimensional array, the photodiodes at the pixels of such a sensor are replaced with photodiodes having metal microstructures 3 (including dielectric films 4) as described above embedded therein. When a color line sensor is to be provided, color filters and on-chip lenses are provided above the imaging region.

The solid-state imaging device according to the second embodiment provides the same effects and advantages as those of the first embodiment described above. Specifically, the cylindrical metal microstructures 3 for exciting surface plasmons are embedded in the photodiodes of the pixels. Therefore, the metal microstructures 3 have a horizontal sectional area which is small when viewed in the traveling direction of incident light, and a small amount of light is reflected at the metal microstructures 3. As a result, any reduction in the flux of incident light into the photodiodes can be suppressed, and optical energy can be efficiently converted into signal charges. Electric fields enhanced by propagating plasmons generated by the cylindrical metal microstructures 3 are directly excited in wide areas in the photodiodes. Therefore, the photodiodes or the sensor can be provided with improved sensitivity and a small thickness. Since the photodiodes have a small thickness, light incident on a pixel is less likely to enter neighboring pixels, and color mixing can therefore be prevented.

In the solid-state imaging device of the present embodiment, enhancement of light beams having different wavelengths, i.e., red, green, and blue light beams can be easily carried out by adjusting the diameter of the cylindrical shape of the metal microstructures 3. Since light is controlled by the construction of the metal microstructures 3, designing can be carried out with freedom to obtain desired characteristics.

The cylindrical metal microstructures 3 can be manufactured easily because the diameter or the length of the microstructures is several hundred nm, and less strict requirements are therefore placed on the control of manufacture variation when compared to metal nanoparticles according to the related art.

3 Third Embodiment

Figure 12:
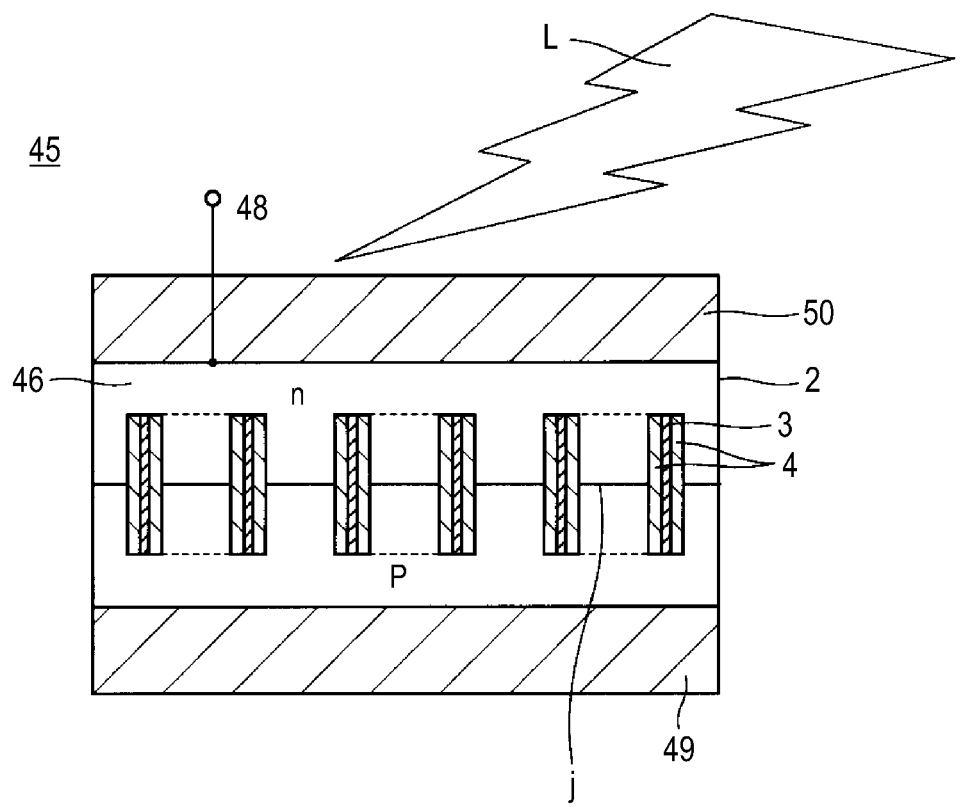
FIG. 12 is a schematic illustration showing a configuration of a third embodiment of the invention that is a semiconductor device according to the invention used as a solar battery.

Exemplary Schematic Configuration of Semiconductor Device Configured as Solar Battery FIGS. 12A and 12B show a third embodiment of the invention which is a semiconductor device according to the invention used as a solar battery. A solar battery 45 according to the third embodiment is provided by forming an n-type semiconductor region 46 and a p-type semiconductor region 47 to form a p-n junction j in a semiconductor substrate 2 to serve as a photoelectric conversion layer and embedding a plurality of cylindrical metal microstructures 3 (including dielectric films 4) in the semiconductor substrate 2, in the same manner as described above. Further, a transparent electrode 48 is formed on a top surface of the semiconductor substrate 2 on which solar light L impinges, and an electrode 49, which is paired with the transparent electrode 48, is formed on a bottom surface of the substrate. An anti-reflection film 50 is formed on the transparent electrode 48. The p-n junction j is formed such that it extends across the cylindrical metal microstructures 3 in the middle of the microstructures 3 when viewed in the longitudinal direction thereof.

The solar light L enters the solar battery 45 according to the third embodiment through the top surface of the semiconductor substrate 2 to serve as a photoelectric conversion layer. Since the anti-reflection film 50 is provided on the top of the layer, the solar light L can be efficiently made to enter the solar battery 45. The incident solar light L is accumulated with its optical energy enhanced by the effect of plasmons generated by the cylindrical metal microstructures 3 as described above, and electrons are efficiently generated from the optical energy at the p-n junction. The electrons are extracted as a current by the pair of electrodes 48 and 49 on the top and bottom of the substrate.

In the solar battery 45 according to the third embodiment, the incident solar light L is enhanced by the cylindrical metal microstructures 3, and electrons can therefore be efficiently generated. Thus, the solar battery can be provided with improved sensitivity. Further, the solar battery can be provided with a small thickness.

4. Fourth Embodiment

Exemplary Configuration of Electronic Apparatus

A solid-state imaging device according to the above-described embodiment of the invention may be used in electronic apparatus such as camera systems including digital cameras and video cameras, mobile telephones having an imaging function, and other types of apparatus having an imaging function.

Figure 13:
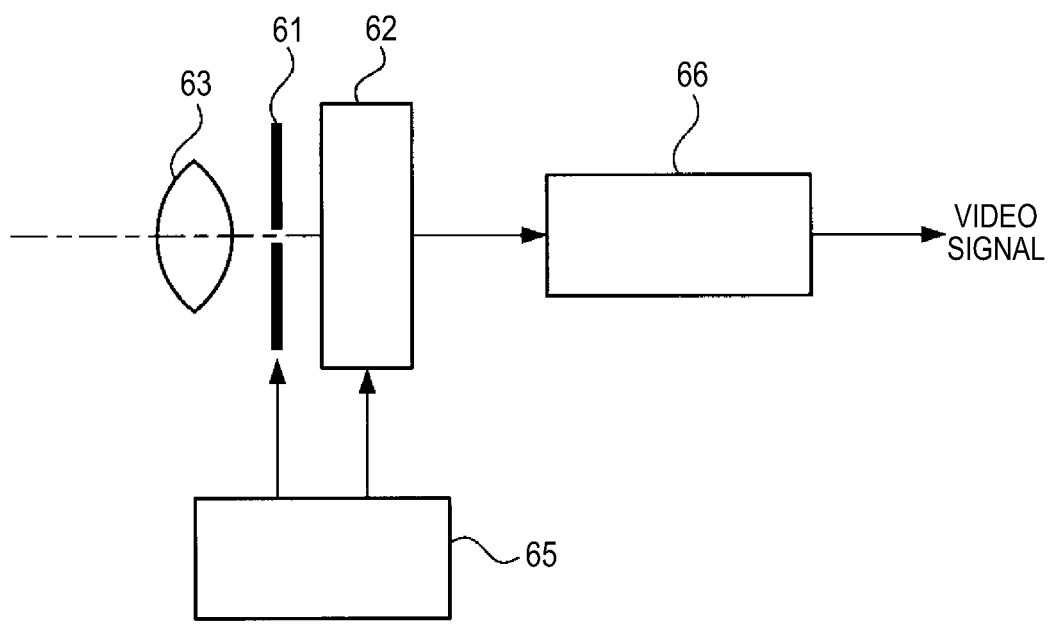
FIG. 13 is a schematic illustration of a configuration of an electronic apparatus according to a fourth embodiment of the invention.
Figure 14A:
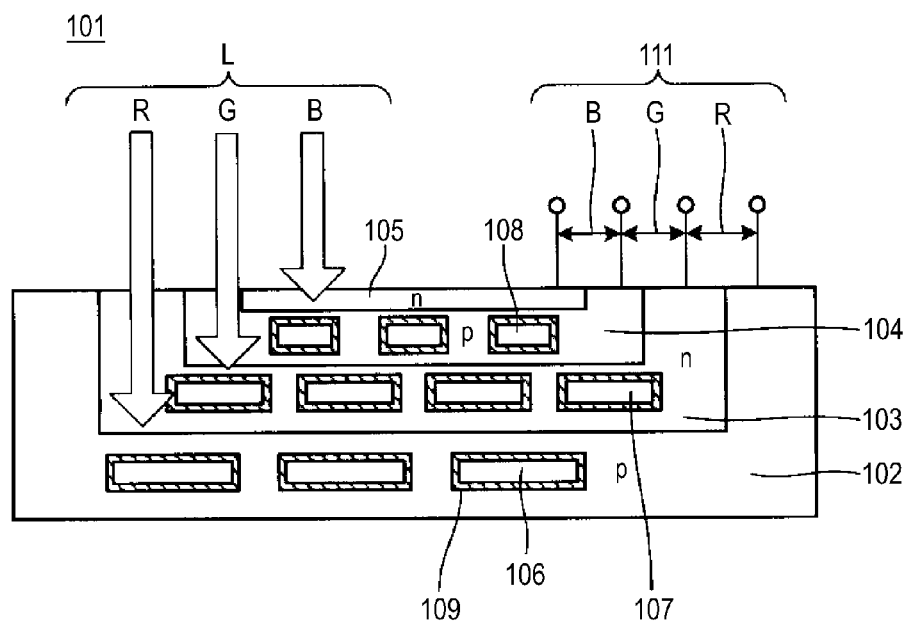
FIGS. 14A and 14B are illustrations of a configuration of an exemplary image sensor according to the related art.
Figure 14B:
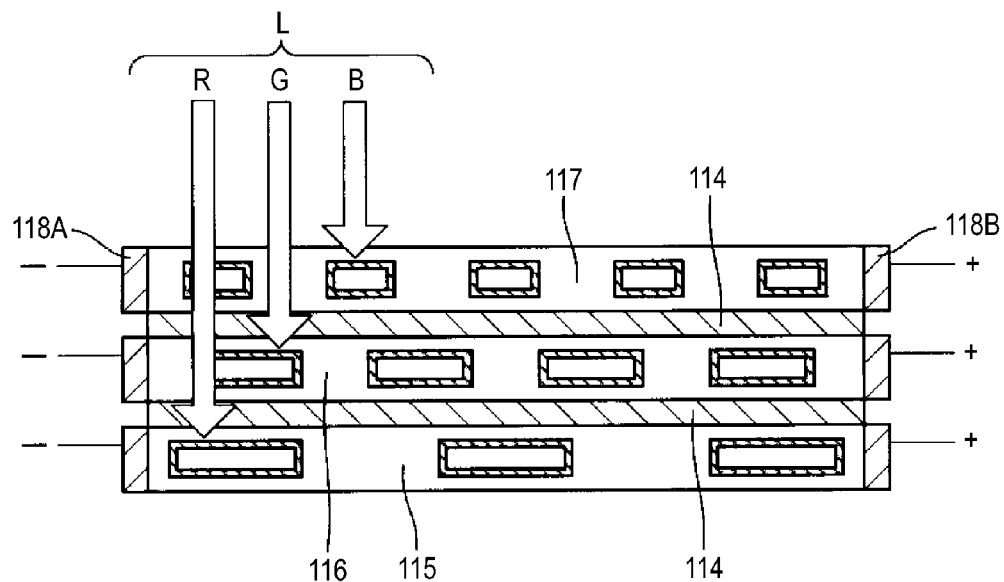
Figure 15A:
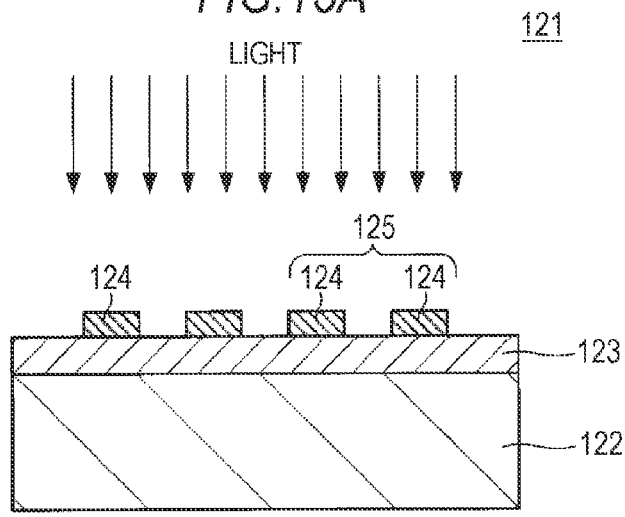
FIGS. 15A and 15B are illustrations of a configuration of another exemplary image sensor according to the related art.
Figure 15B:
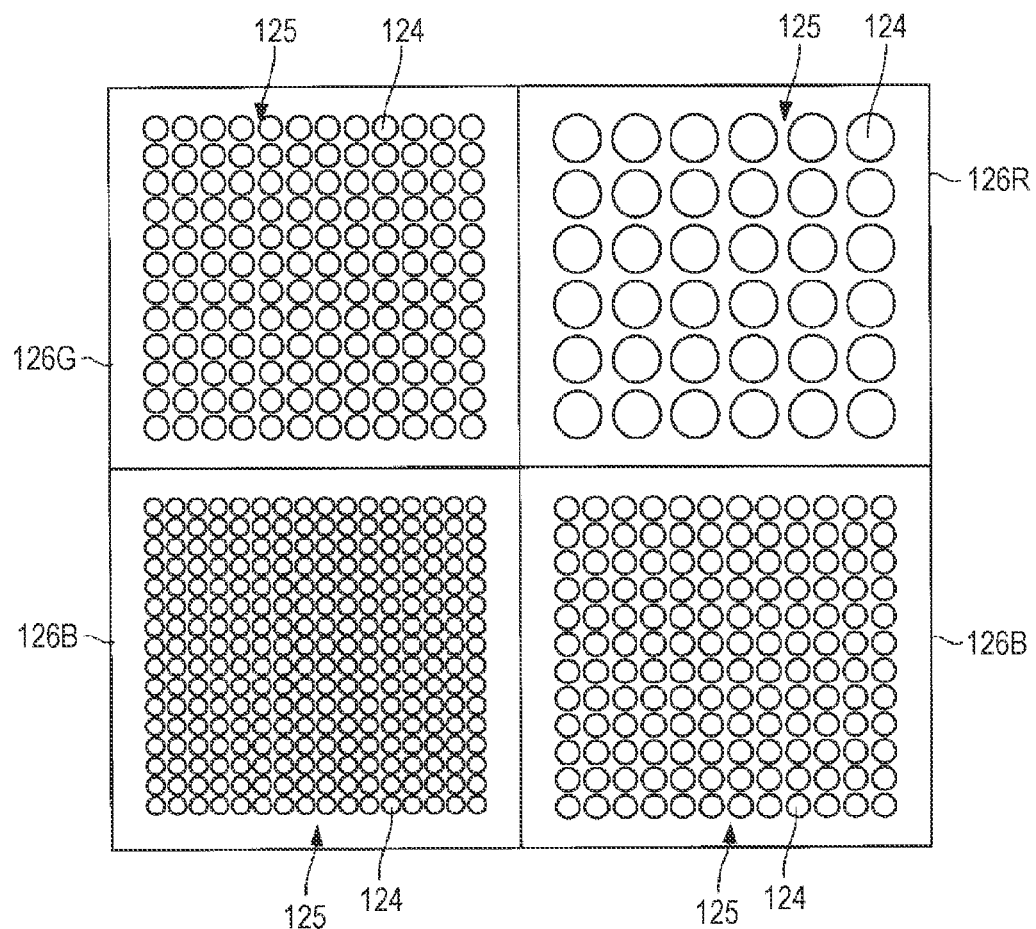

FIG. 13 shows a fourth embodiment of the invention that is an electronic apparatus according to the invention used as a camera. The camera according to the present embodiment is a video camera capable of taking still or motion pictures. A camera 61 of the present embodiment includes a solid-state imaging device 62, an optical system 63 guiding incident light to a light-receiving sensor section of the solid-state imaging device 62, and a shutter device 64. Further, the camera 61 includes a driving circuit 65 driving the solid-state imaging device 62 and a signal processing circuit 66 for processing signals output from the solid-state imaging device 62.

Any of the solid-state imaging devices described above as the second embodiment of the invention may be used as the solid-state imaging device 62. The optical system (optical lens) 63 forms an image of image light (incident light) from an object on an imaging surface of the solid-state imaging device 62. Thus, signal charges are accumulated in the solid-state imaging device 62 for a certain period of time. An optical lens system formed by a plurality of optical lenses may be used as the optical system 63. The shutter device 64 controls periods for which the solid-state imaging device 62 is illuminated and shaded. The driving circuit 65 supplies drive signals for controlling a transfer operation of the solid-state imaging device 62 and the shutter operation of the shutter device 64. Signals are transferred from the solid-state imaging device 62 according to a drive signal (timing signal) supplied by the driving circuit 65. The signal processing circuit 66 performs signal processing of various types. Video signals which have received signal processing are recorded in a recording medium such as a memory or output to a monitor.

The electronic apparatus such as a camera according to the fourth embodiment can be provided with a smaller thickness and higher sensitivity because the light-receiving sensor section includes a solid-state imaging device which utilizes the propagating plasmon phenomenon.

The present application contains subject matter related to that disclosed in Japanese Priority Patent Application JP 2009-298365 filed in the Japan Patent Office on Dec. 28, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising: a photoelectric conversion layer; a continuous or discontinuous hollow cylindrical metal microstructure embedded in the photoelectric conversion layer; and a dielectric film with which an inner side surface and an outer side surface of the metal microstructure are coated, wherein the inner side surface is the inner diameter of the metal microstructure and the outer side surface is the outer diameter of the metal microstructure.

2. A semiconductor device according to claim 1, wherein the metal microstructure is formed from a metal material which has a negative dielectric constant when coupled with light; and the dielectric film is formed from a dielectric material having a refractive index whose real part is 3.0 or less.

3. A semiconductor device according to claim 1, wherein a light transmitting layer made of the same material as the photoelectric conversion layer is formed on a top surface and a bottom surface of the metal microstructure.

4. A semiconductor device according to claim 1, wherein the inner diameter of the metal microstructure or an inner length that the metal microstructure has when viewed from above is in the range from 100 nm to 1.0 .mu.m; the metal microstructure has a thickness in the range from 10 nm to 100 nm; and the metal microstructure has a total length in the range from 20 nm to 3.0 .mu.m.

5. A semiconductor device according to claim 1, further comprising a dielectric film with which a top end surface and a bottom end surface of the metal microstructure is formed, the dielectric film being made of the same material as the dielectric film for coating the inner and outer side surfaces of the microstructure.

6. A semiconductor device according to claim 1, further comprising a p-n junction provided in the photoelectric conversion layer to extend across the metal microstructure in the middle of the microstructure in the longitudinal direction thereof.

7. A semiconductor device according to claim 1, further comprising: an imaging region formed by an array of a plurality of pixels; and a plurality of the metal microstructures embedded in the photoelectric conversion layer provided at each of the plurality of pixels, the semiconductor device being formed as a solid-state imaging device.

8. A semiconductor device according to claim 7, wherein the plurality of pixels include a red pixel, a green pixel, and a blue pixel; the outer diameter of the metal microstructures at the green pixel is set smaller than the outer diameter of the metal microstructures at the red pixel; and the outer diameter of the metal microstructures at the blue pixel is set smaller than the outer diameter of the metal microstructures at the green pixel.

9. A semiconductor device according to claim 8, further comprising a color filter provided on the imaging region.

10. A semiconductor device according to claim 1, wherein the photoelectric conversion layer has a p-n junction; and the metal microstructure is embedded in the photoelectric conversion layer to extend through the p-n junction, the semiconductor device being formed as a solar battery.

11. An electronic apparatus comprising: a semiconductor device according to claim 7 formed as a solid-state imaging device; and a signal processing circuit processing a signal output by the semiconductor device.

* * * * *